US010581327B2

(12) United States Patent
Zhou et al.

(10) Patent No.: US 10,581,327 B2
(45) Date of Patent: Mar. 3, 2020

(54) SYMMETRICAL POWER STAGES FOR HIGH POWER INTEGRATED CIRCUITS

(71) Applicant: MONOLITHIC POWER SYSTEMS, INC., San Jose, CA (US)

(72) Inventors: Jinghai Zhou, Cupertino, CA (US); Chia-Hsin Chang, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 16/438,063

(22) Filed: Jun. 11, 2019

(65) Prior Publication Data

US 2019/0296645 A1    Sep. 26, 2019

Related U.S. Application Data

(63) Continuation of application No. 15/784,430, filed on Oct. 16, 2017, now Pat. No. 10,361,631.

(60) Provisional application No. 62/572,333, filed on Oct. 13, 2017, provisional application No. 62/568,391, filed on Oct. 5, 2017.

(51) Int. Cl.
| | |
|---|---|
| *H05K 7/20* | (2006.01) |
| *H02M 3/158* | (2006.01) |
| *H05K 1/02* | (2006.01) |
| *H05K 1/18* | (2006.01) |

(52) U.S. Cl.
CPC ........ *H02M 3/1584* (2013.01); *H05K 1/0203* (2013.01); *H05K 1/181* (2013.01); *H05K 2201/066* (2013.01); *H05K 2201/1003* (2013.01); *H05K 2201/10015* (2013.01); *H05K 2201/10166* (2013.01); *H05K 2201/10522* (2013.01); *H05K 2201/10545* (2013.01)

(58) Field of Classification Search
CPC ... H02M 3/1584; H05K 1/0203; H05K 1/181; H05K 2201/066; H05K 2201/10015; H05K 2201/1003; H05K 2201/10166; H05K 2201/10522
See application file for complete search history.

(56) References Cited

U.S. PATENT DOCUMENTS

| | | | | |
|---|---|---|---|---|
| 2012/0002455 | A1* | 1/2012 | Sullivan | G06F 1/10 365/51 |
| 2015/0207429 | A1* | 7/2015 | Akiyama | H02M 1/088 363/131 |
| 2015/0249047 | A1* | 9/2015 | Long | H01L 23/49844 257/776 |
| 2016/0155692 | A1* | 6/2016 | Dosluoglu | H01L 23/49822 257/379 |

(Continued)

*Primary Examiner* — Yuriy Semenenko
(74) *Attorney, Agent, or Firm* — Okamoto & Benedicto LLP (57) ABSTRACT

A circuit assembly for a power converter includes power stage blocks and heat-dissipating substrate. A power stage block includes a power stage IC die, an output inductor that is connected to a switch node of the power stage IC die, and capacitors that form an output capacitor of the power stage block. The output capacitors of the power stage blocks are symmetrically arranged. The output inductors can be placed on the same side of the substrate as the power stage IC dies, or on a side of the substrate that is opposite to the side where the power stage IC dies are disposed. A power stage block may generate two output phases of the power converter.

14 Claims, 10 Drawing Sheets

(56) References Cited

U.S. PATENT DOCUMENTS

2016/0380538 A1* 12/2016 Tang ................. H02M 3/158
                                                    323/271
2017/0331371 A1* 11/2017 Parto ................. H02M 3/156
2019/0089244 A1*  3/2019 Koski ................ H02M 7/003

* cited by examiner

SYMMETRICAL POWER STAGES FOR HIGH POWER INTEGRATED CIRCUITS

CROSS-REFERENCE TO RELATED APPLICATIONS

This application is a continuation of U.S. patent application Ser. No. 15/784,430, filed on Oct. 16, 2017, now U.S. Pat. No. 10,361,631, which claims the benefit of U.S. Provisional Application No. 62/572,333, filed on Oct. 13, 2017 and the benefit of U.S. Provisional Application No. 62/568,391, filed on Oct. 5, 2017. The aforementioned related applications are incorporated herein by reference in their entirety.

BACKGROUND OF THE INVENTION

1. Field of the Invention

The present invention relates generally to electrical circuits, and more particularly but not exclusively to circuit assemblies with high power integrated circuits.

2. Description of the Background Art

Power converters are employed to provide a supply voltage to various electrical devices. The output power of a power converter may be increased by adding output phases. Although not usually a problem with discrete circuits, a multiphase power converter in integrated circuit (IC) form may generate excessive heat that may be difficult to dissipate without making compromises to the form factor of the substrate containing the power converter.

SUMMARY

In one embodiment, a circuit assembly for a power converter includes power stage blocks and a heat-dissipating substrate. A power stage block includes a power stage IC die, an output inductor that is connected to a switch node of the power stage IC die, and capacitors that form an output capacitor of the power stage block. The output capacitors of the power stage blocks are symmetrically arranged. The output inductors can be placed on the same side of the substrate as the power stage IC dies, or on a side of the substrate that is opposite to the side where the power stage IC dies are disposed. A power stage block may generate two output phases of the power converter.

These and other features of the present invention will be readily apparent to persons of ordinary skill in the art upon reading the entirety of this disclosure, which includes the accompanying drawings and claims.

DESCRIPTION OF THE DRAWINGS

The use of the same reference label in different drawings indicates the same or like components.

DETAILED DESCRIPTION

Figure 1:
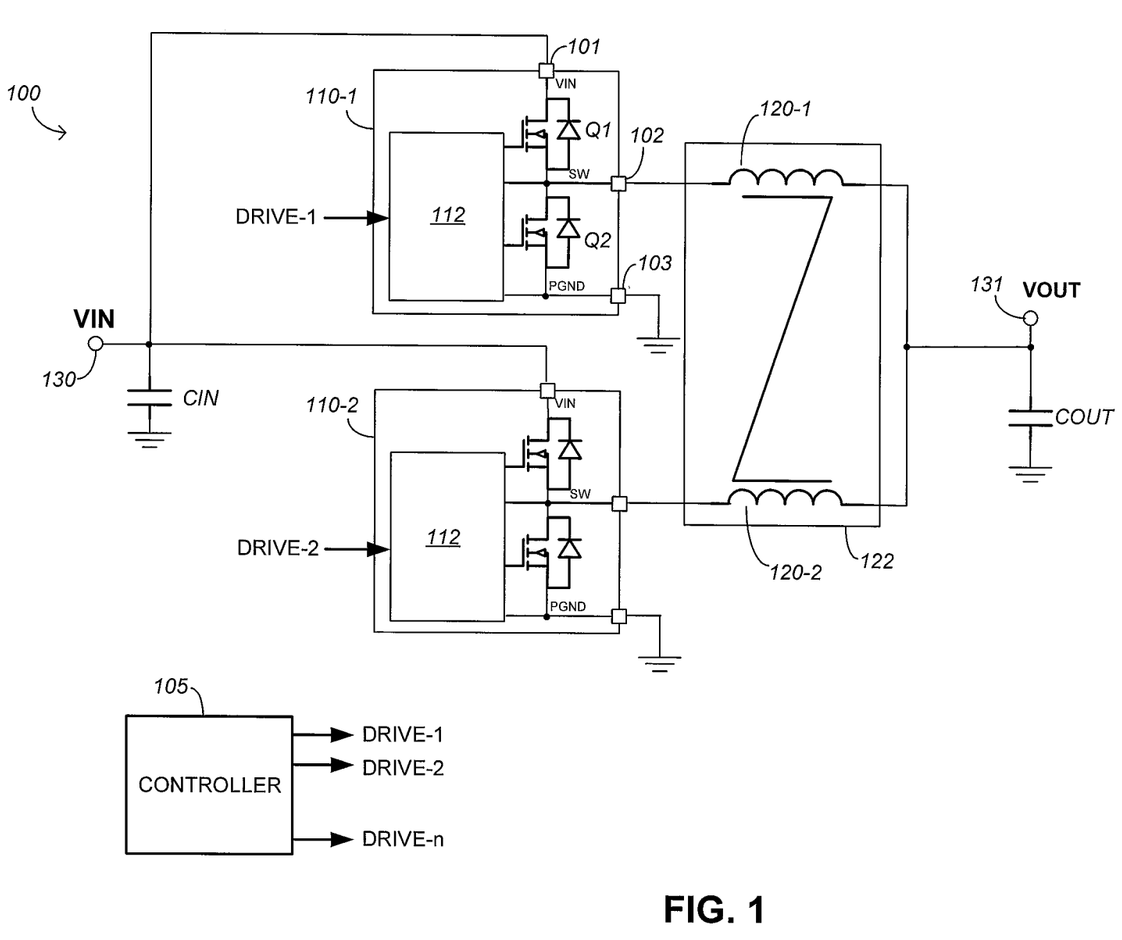
FIG. 1 is a schematic diagram of a power converter in accordance with an embodiment of the present invention.

FIG. 1 is a schematic diagram of a power converter 100 in accordance with an embodiment of the present invention. In the example of FIG. 1, the power converter 100 is a multiphase power converter. The power converter 100 includes a plurality of power stage integrated circuit (IC) dies 110 (110-1, 110-2), one for each output phase. A controller 105 (e.g., PWM controller) generates drive signals DRIVE-1, DRIVE-2, . . . , DRIVE-n, one for each power stage IC die 110, to convert an input voltage VIN to an output voltage VOUT. An input capacitor CIN receives the input voltage VIN at a node 130. The output voltage is developed across an output capacitor COUT at a node 131.

In the example of FIG. 1, the controller 105 is external to the power stage IC dies 110. In other embodiments, a power stage IC die 110 may internally include an integrated controller.

In the example of FIG. 1, a power stage IC die 110 includes a driver circuit 112, a high side switch Q1 (e.g., MOS transistor), and a low side switch Q2 (e.g., MOS transistor). The power stage IC die 110 may include a node 101 for electrically connecting an electrode (e.g., drain) of the high side switch Q1 to the node 130 to receive the input voltage VIN, a node 102 for electrically connecting a switch node SW to a corresponding output inductor 120 (120-1, 120-2), and a node 103 for electrically connecting an electrode (e.g., source) of the low side switch Q2 to a ground reference.

In one embodiment, the output inductors 120-1 and 120-2 are magnetically coupled by a magnetic core 122 in a so-called inductor-coupled topology. In other embodiments, the magnetic core 122 is omitted, and the output inductors 120-1 and 120-2 are conventional output inductors. A first end of an output inductor 120 is electrically connected to a corresponding switch node 102 and a second end of the output inductor 120 is electrically connected to the common output node 131 to provide the output voltage VOUT on the output capacitor COUT.

Figure 2:
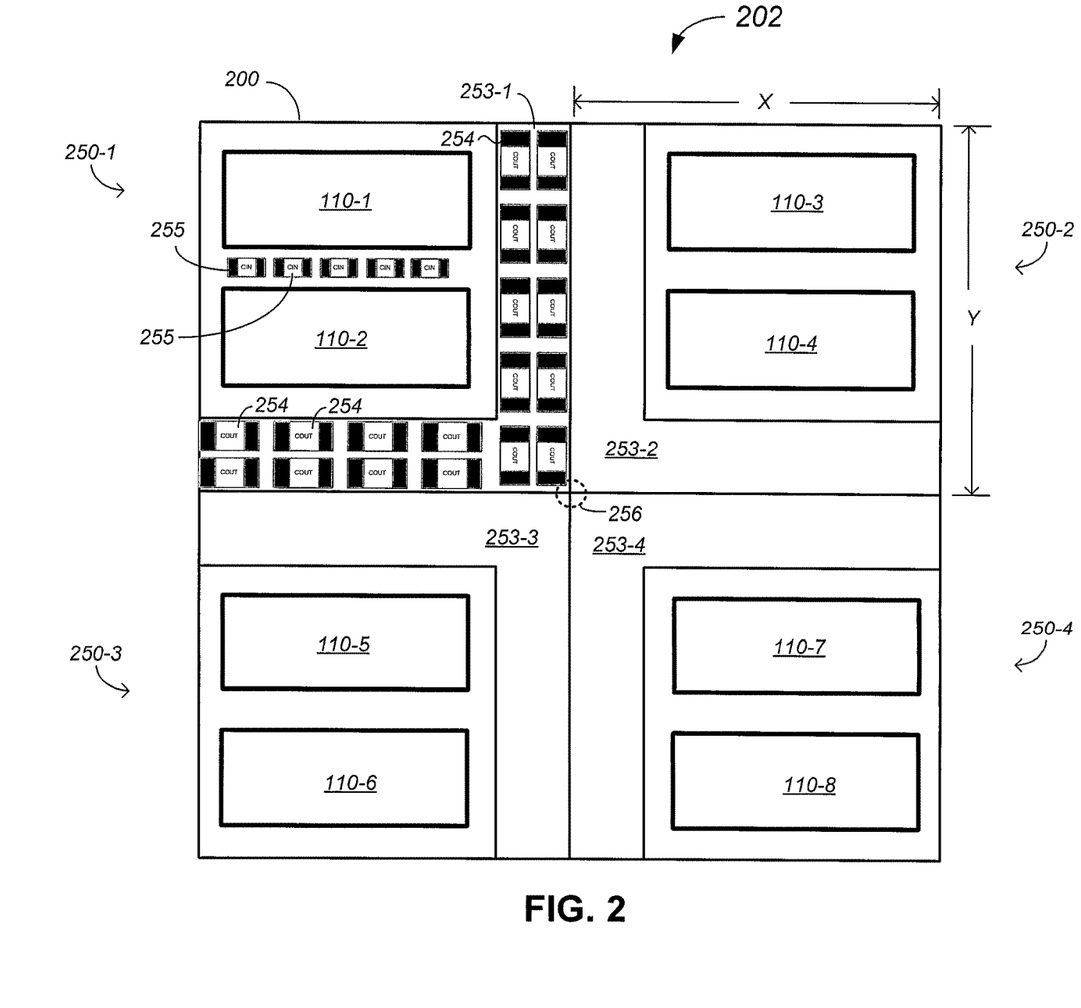
FIG. 2 is a plan view of a circuit assembly of the power converter of FIG. 1 in accordance with an embodiment of the present invention.

FIG. 2 is a plan view of a circuit assembly 202 of the power converter 100 in accordance with an embodiment of the present invention. In the example of FIG. 2, the circuit assembly 202 has a layout that includes a plurality of power stage blocks 250 (250-1, 250-2, 250-3, 250-4) that are formed on a substrate 200. Each power stage block 250 includes two power stage IC dies 110 to provide two output phases per block. Each power stage block 250 may occupy an X by Y area of the substrate 200. In one embodiment, each power stage block 250 is formed on a 10 mm×10 mm area of the substrate 200 and provides two output phases. The circuit assembly 202 may be configured to have a power rating of 500 W, for example.

In the example of FIG. 2, the boundaries of the power stage blocks 250 all meet at a center 256. The power stage blocks 250 are symmetrically arranged for optimum power delivery. The following description of the power stage block 250-1 applies to the other power stage blocks 250.

In the example of FIG. 2, the power stage block 250-1 comprises a plurality of power stage IC dies 110, a plurality of capacitors 254, and a plurality of capacitors 255. The capacitors 255 are electrically connected in parallel to form the input capacitor CIN, and the capacitors 254 are electrically connected in parallel to form the output capacitor COUT. A power stage IC die 110-1 and a power stage IC die 110-2 are mounted on the substrate 200, with the capacitors 255 being mounted on the substrate 200 between the power stage IC dies 110-1 and 110-2. The capacitors 254 are mounted on the substrate 200 in an output capacitor region 253-1.

As shown in FIG. 2, the boundaries of the output capacitor regions 253 (253-1, 253-2, 253-3, 253-4) of the power stage blocks 250 are adjacent to one another. Because the capacitors 254 form the output capacitors COUT, the layout of the output capacitor regions 203 facilitates inter-connection of the output capacitors COUT. In the example of FIG. 2, the circuit assembly 202 includes eight power stage IC dies 110 (110-1, 110-2, . . . , 110-8), thereby providing eight output phases. The output capacitors COUT of the power stage blocks 250 are coupled to the same output node 131 of the power converter 100 to provide an eight-phase output voltage VOUT.

Figure 3:
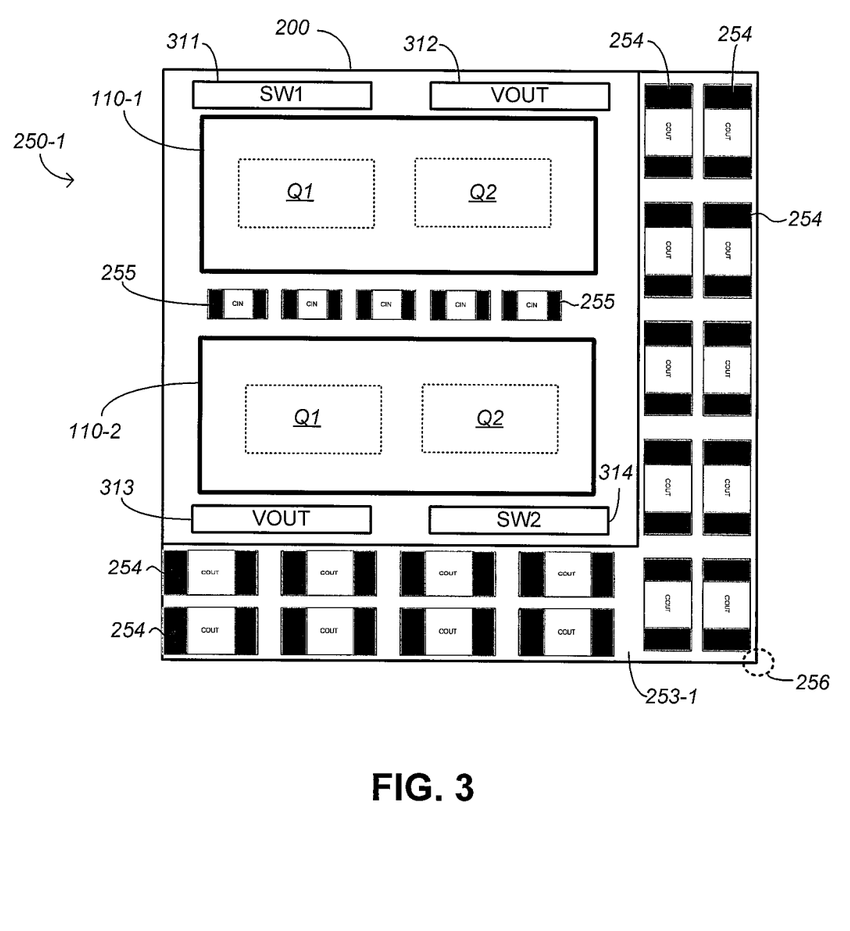
FIG. 3 is a plan view of the circuit assembly of FIG. 2, showing pads of a power stage block, in accordance with an embodiment of the present invention.

FIG. 3 is a plan view of the circuit assembly 202 of the power converter 100, showing pads 311-314 of the power stage block 250-1, in accordance with an embodiment of the present invention. In one embodiment, the pads 311-314 are solder pads on the substrate 200. In the example of FIG. 3, the pad 311 is electrically connected to the switch node SW (see FIG. 1, 102) of the power stage IC die 110-1, and the pad 314 is electrically connected to the switch node SW of the power stage IC die 110-2. The pads 312 and 313 are electrically connected to the common output voltage node (see FIG. 1, 131). The first end of the output inductor 120-1 may be electrically connected to the pad 311 and the second end of the output inductor 120-1 may be electrically connected to the pad 313. Similarly, the first end of the output inductor 120-2 may be electrically connected to the pad 312 and the second end of the output inductor 120-2 may be electrically connected to the pad 314.

Figure 4:
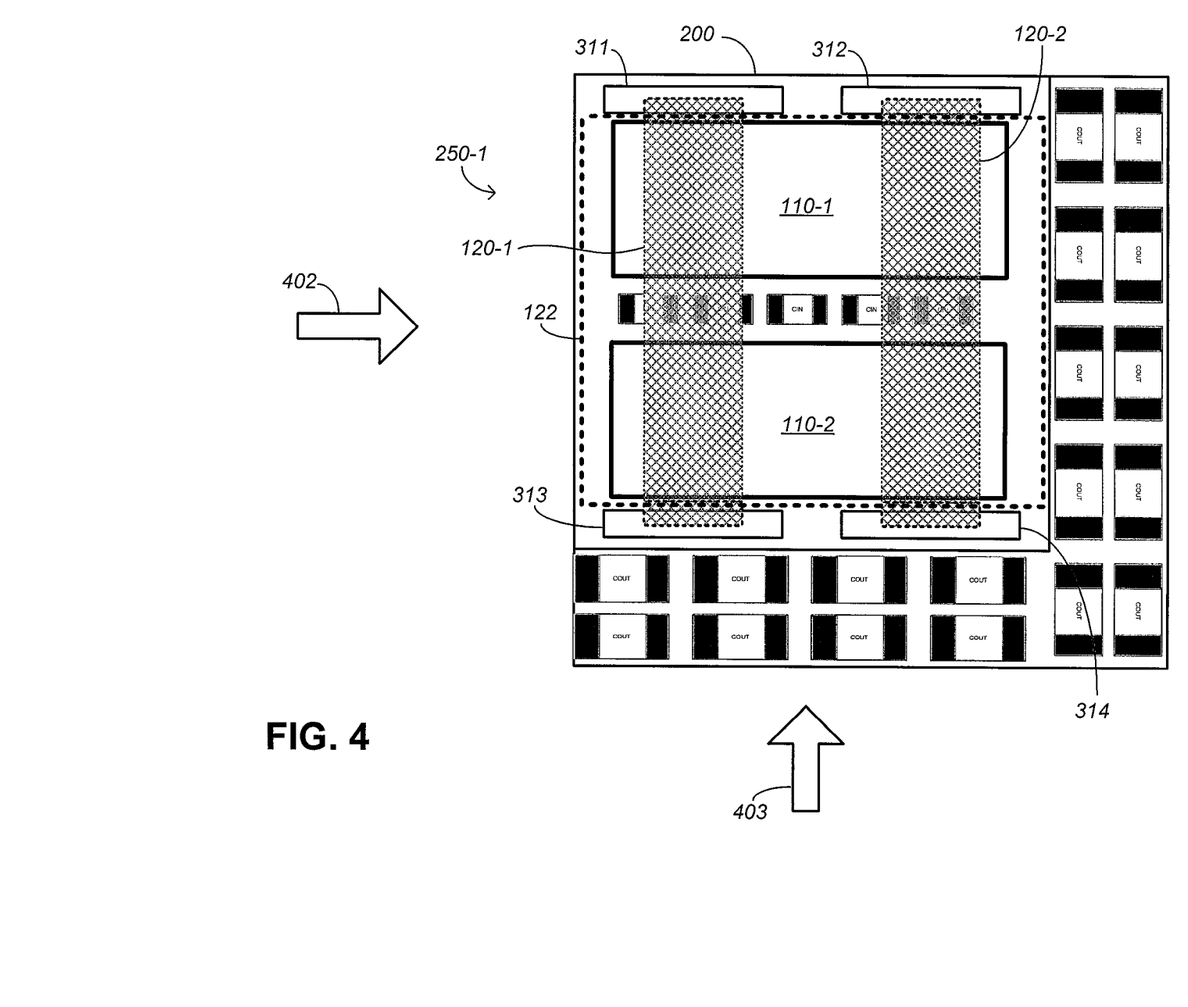
FIG. 4 is a plan view of the circuit assembly of FIG. 2, showing output inductors of a power stage block, in accordance with an embodiment of the present invention.

FIG. 4 is a plan view of the circuit assembly 202 of the power converter 100, showing the output inductors 120 of the power stage block 250-1, in accordance with an embodiment of the present invention. In one embodiment, as later described with reference to FIGS. 5 and 6, the output inductors 120 are mounted on the same side of the substrate 200 as the power stage IC dies 110. In other embodiments, as later described with reference to FIGS. 7 and 8, the power stage IC dies 110 are embedded in the substrate 200. In other embodiments, as later described with reference to FIGS. 9 and 10, the output inductors 120 are mounted on the side of the substrate 200 that is opposite to the side of the substrate 200 where the power stage IC dies 110 are mounted. In general, in light of the present disclosure, the components of the circuit assembly 202 may be in different locations depending on the particular application. Components of the circuit assembly 202 may be electrically connected by way of vias, electrical traces on a surface of the substrate 200, interconnect lines embedded in the substrate 200, etc., without detracting from the merits of the present invention.

In the example of FIG. 4, the first end of the output inductor 120-1 is electrically connected to the pad 311, and the second end of the output inductor 120-1 is electrically connected to the pad 313. Similarly, the first end of the output inductor 120-2 is electrically connected to the pad 312, and the second end of the output inductor 120-2 is electrically connected to the pad 314. An output inductor 120 may be electrically connected to a pad by soldering, for example. The magnetic core 122 is indicated in FIG. 4 as dashed lines.

In the example of FIG. 4, an arrow 402 points to one side of the power stage block 250-1, and an arrow 403 points to another side of the power stage block 250-1. For clarity of illustration, the intervening power stage block 250-3 (see FIG. 2) is not shown in subsequent figures showing the side pointed by the arrow 403.

Figure 5:
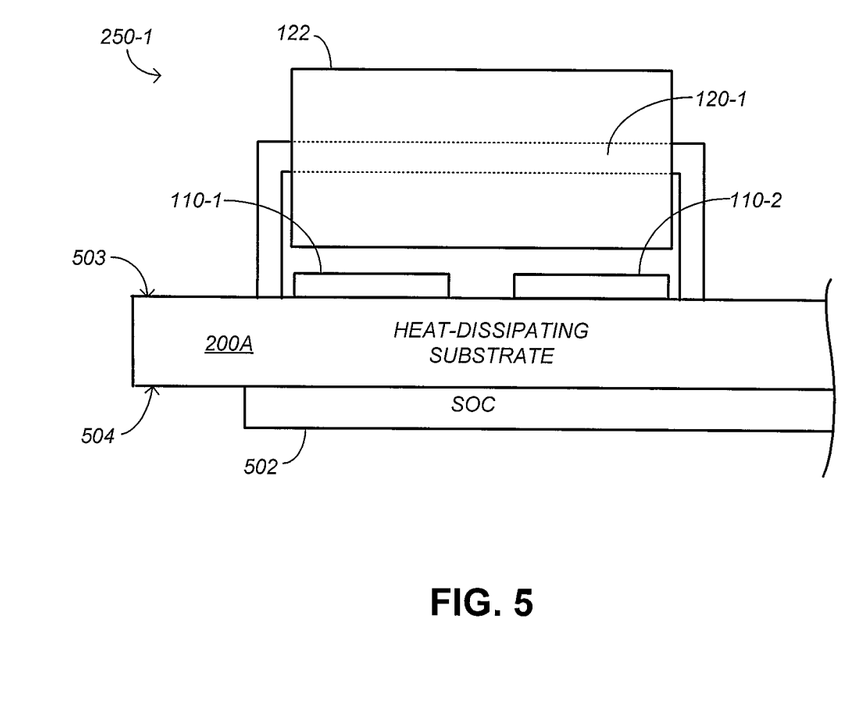
FIGS. 5 and 6 are side views of the circuit assembly of FIG. 4 in accordance with an embodiment of the present invention.
Figure 6:
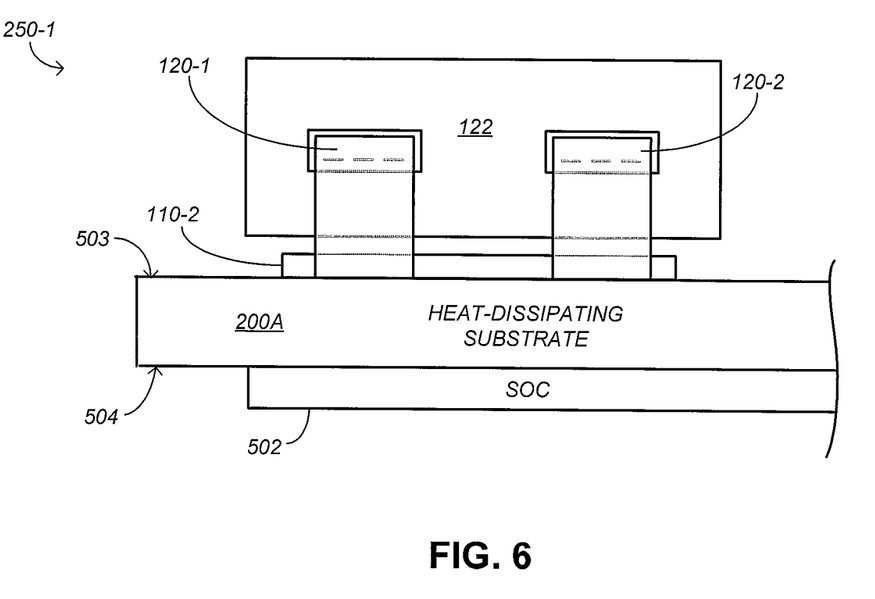

FIGS. 5 and 6 are side views of the circuit assembly 202 of the power converter 100 in accordance with an embodiment of the present invention. FIG. 5 shows the side of the circuit assembly 202 viewed in a direction pointed by the arrow 402, and FIG. 6 shows the side of the circuit assembly 202 viewed in a direction pointed by the arrow 403 (see FIG. 4). In the example of FIGS. 5 and 6, the substrate 200 is relabeled as "200A" to indicate that it is a heat-dissipating substrate, such as a Bismaleimide-Triazine resin substrate. Use of a heat-dissipating substrate advantageously allows heat dissipation without necessarily using a heatsink. The substrate 200A may have embedded copper layers for additional heat dissipation.

In the example of FIG. 5, the substrate 200A has a side 503 and an opposing side 504. The power stage IC dies 110 are mounted on the side 503. The inductors 120 go through the magnetic core 122 and are formed over the power stage IC dies 110 on the side 503. A system on chip (SOC) die 502 is mounted on the side 504. The die 502 may comprise an integrated circuit that is powered by the output of the power converter 100. FIG. 6 shows the side view of the substrate 200A, viewed from the direction pointed by the arrow 403.

Figure 7:
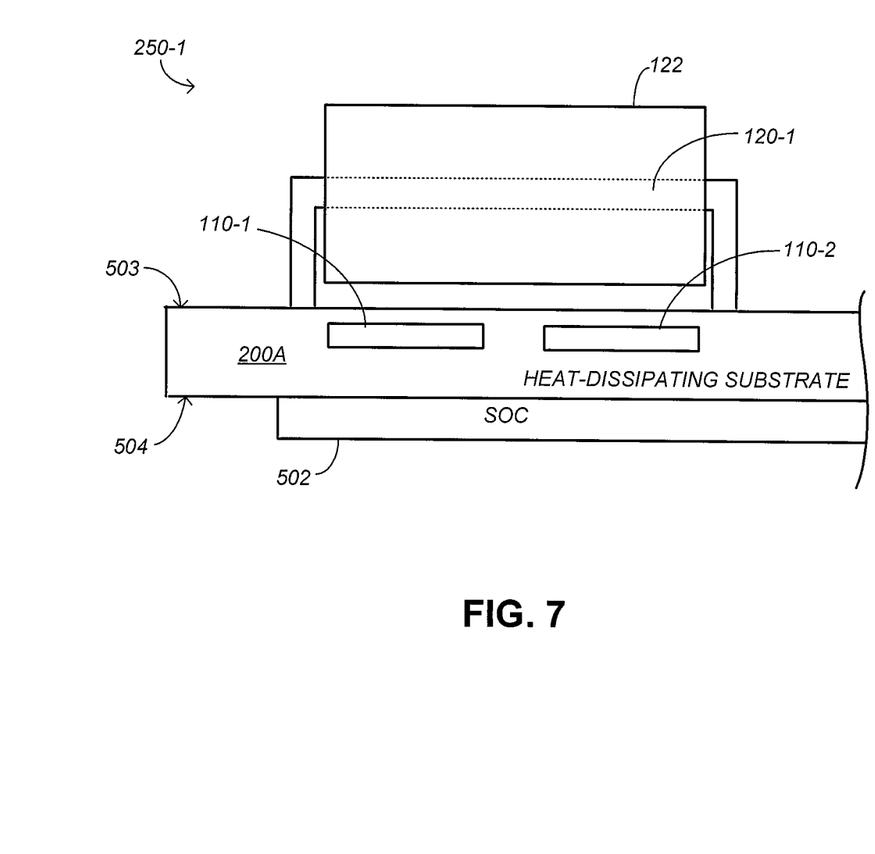
FIGS. 7 and 8 are side views of the circuit assembly of FIG. 4 in accordance with another embodiment of the present invention.
Figure 8:
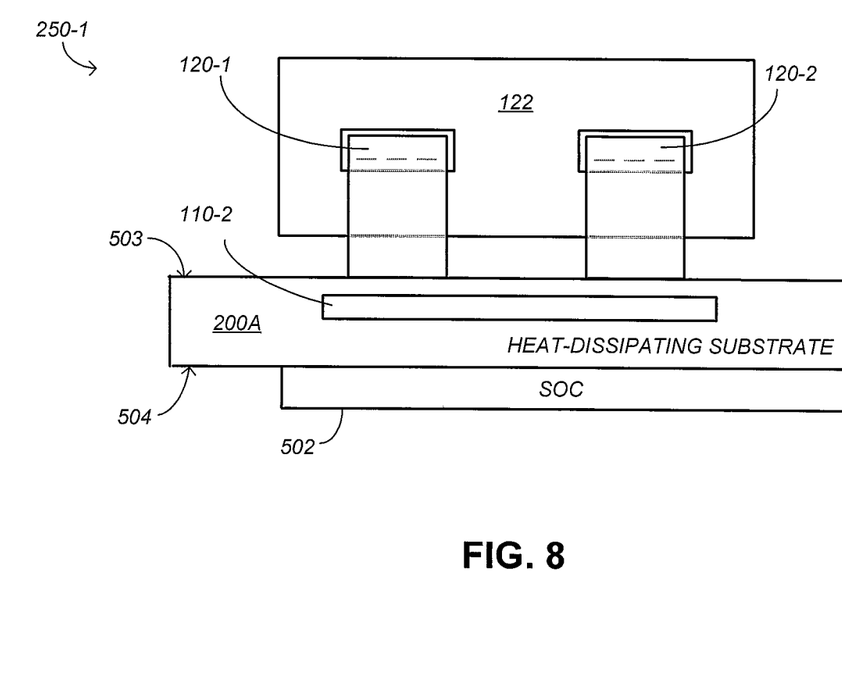

FIGS. 7 and 8 are side views of the circuit assembly 202 of the power converter 100 in accordance with an embodiment of the present invention. FIG. 7 shows the side of the circuit assembly 202 viewed in a direction pointed by the arrow 402, and FIG. 8 shows the side of the circuit assembly 202 viewed in a direction pointed by the arrow 403 (see FIG. 4). The example of FIGS. 7 and 8 are the same as in FIGS. 5 and 6 except that the power stage IC dies 110 are embedded in the substrate 200A.

Figure 9:
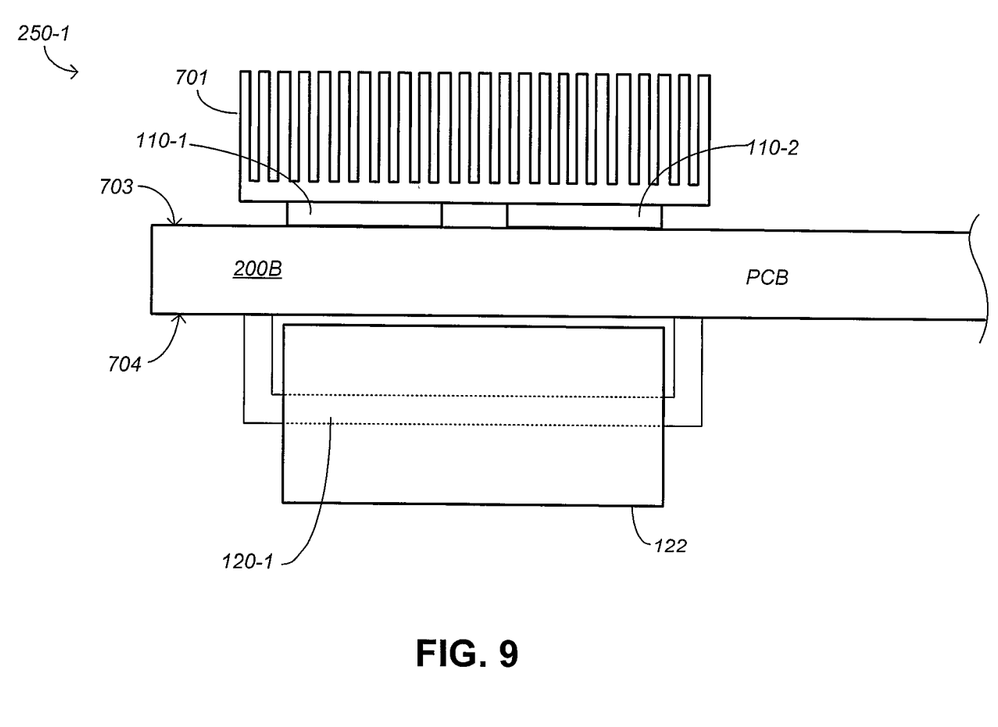
FIGS. 9 and 10 are side views of the circuit assembly of FIG. 4 in accordance with another embodiment of the present invention.
Figure 10:
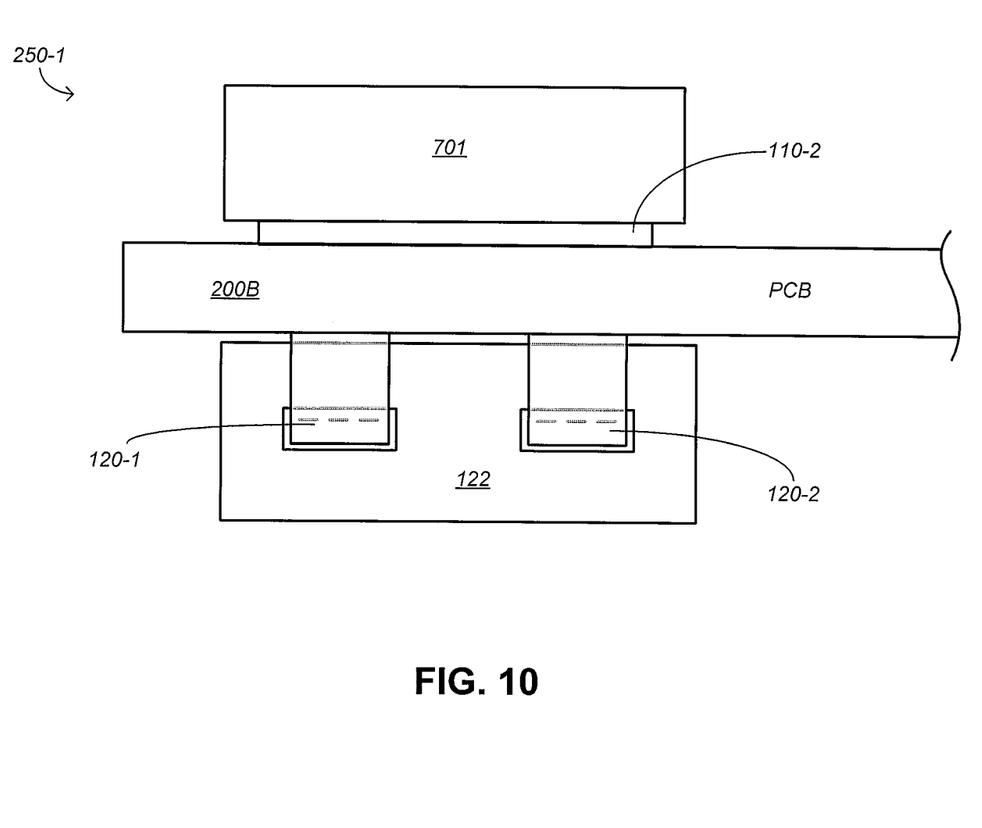

FIGS. 9 and 10 are side views of the circuit assembly 202 of the power converter 100 in accordance with an embodiment of the present invention. FIG. 9 shows the side of the circuit assembly 202 viewed in a direction pointed by the arrow 402, and FIG. 10 shows the side of the circuit assembly 202 viewed in a direction pointed by the arrow 403 (see FIG. 4). In the example of FIGS. 9 and 10, the substrate 200 is relabeled as "200B" to indicate that it is a printed circuit board (PCB).

In the example of FIG. 9, the substrate 200B has a side 703 and an opposing side 704. The power stage IC dies 110 are mounted on the side 703. An optional heatsink 701 may be attached to the power stage IC dies 110 for heat dissipation. The inductors 120 go through the magnetic core 122 and are mounted on the side 704. An SOC die or other integrated circuit (not shown) that receives power from the power converter 100 may be mounted on either side of the substrate 200B. FIG. 10 shows the side view of the substrate 200B, viewed from the direction pointed by the arrow 403.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A circuit assembly comprising:
a heat-dissipating substrate, the substrate having a first side and a second side that is opposite the first side;
a first power stage integrated circuit (IC) die disposed on a surface of the first side of the substrate;
a second power stage IC die disposed on the surface of the first side of the substrate;
a first output inductor disposed across the first power stage IC die and the second power stage IC die on the first side of the substrate, the first output inductor having a first end that is coupled to a switch node of the first power stage IC die and a second end that is coupled to an output node;
a second output inductor disposed across the first power stage IC die and the second power stage IC die on the first side of the substrate, the second output inductor having a first end that is coupled to a switch node of the second power stage IC die and a second end that is coupled to the output node; and
an integrated circuit that is disposed on a surface of the second side of the substrate, the integrated circuit being powered by a voltage at the output node.

2. The circuit assembly of claim 1, wherein the substrate comprises Bismaleimide-Triazine.

3. The circuit assembly of claim 1, wherein the substrate has an embedded copper layer.

4. The circuit assembly of claim 1, further comprising:
a first magnetic core that is disposed over the first power stage IC die and the second power stage IC die on the first side of the substrate,
wherein the first output inductor and the second output inductor are disposed through the first magnetic core.

5. The circuit assembly of claim 1, further comprising:
a third power stage IC die and a fourth power stage IC die that are disposed on the surface of the first side of the substrate;
a third output inductor disposed on the first side of the substrate, the third output inductor having a first end that is coupled to a switch node of the third power stage IC die and a second end that is coupled to the output node; and
a fourth output inductor disposed on the first side of the substrate, the fourth output inductor having a first end that is coupled to a switch node of the fourth power stage IC die and a second end that is coupled to the output node.

6. The circuit assembly of claim 5, further comprising:
a second magnetic core that is disposed over the third power stage IC die and the fourth power stage IC die on the first side of the substrate, wherein the third and fourth output inductors are disposed through the second magnetic core.

7. The circuit assembly of claim 1, wherein the integrated circuit powered by the voltage at the output node comprises a system on a chip (SOC).

8. A circuit assembly comprising:
a heat-dissipating substrate having a first side and a second side, the first side being opposite the second side;
a first power stage block disposed on a surface of the first side of the substrate, the first power stage block comprising: a first power stage integrated circuit (IC) die, a second power stage IC die, a first output inductor having a first end that is coupled to a switch node of the first power stage IC die and a second end that is coupled to an output node, a second output inductor having a first end that is coupled to a switch node of the second power stage IC die and a second end that is coupled to the output node, wherein the first and second output inductors are disposed across the first and second power stage IC dies on the first side of the substrate; and
a system on a chip (SOC) die that is disposed on the second side of the substrate, the SOC die being powered by a voltage at the output node.

9. The circuit assembly of claim 8, wherein the substrate comprises Bismaleimide-Triazine.

10. The circuit assembly of claim 8, wherein the substrate has an embedded copper layer.

11. The circuit assembly of claim 8, further comprising:
a second power stage block;
a third power stage block; and
a fourth power stage block,
wherein the first, second, third, and fourth power stage blocks are symmetrically arranged on the surface of the first side of the substrate about a center point where boundaries of the first, second, third, and fourth power stage blocks intersect.

12. The circuit assembly of claim 11, further comprising:
a first plurality of capacitors that serve as an output capacitor of the first power stage block;
a second plurality of capacitors that serve as an output capacitor of the second power stage block;
a third plurality of capacitors that serve as an output capacitor of the third power stage block; and
a fourth plurality of capacitors that serve as an output capacitor of the fourth power stage block,
wherein the first, second, third, and fourth plurality of capacitors are symmetrically arranged on the first side of the substrate about the center point.

13. The circuit assembly of claim 8, further comprising:
a magnetic core that is disposed over the first and second power stage IC dies on the first side of the substrate, wherein the first and second output inductors are disposed through the magnetic core.

14. The circuit assembly of claim 8, wherein the first power stage block further comprises a plurality of capacitors that form an output capacitor of the first power stage block, the output capacitor being coupled to the output node.

* * * * *